(12) United States Patent
Radosevich et al.

(10) Patent No.: US 6,545,456 B1
(45) Date of Patent: Apr. 8, 2003

(54) HALL EFFECT CURRENT SENSOR PACKAGE FOR SENSING ELECTRICAL CURRENT IN AN ELECTRICAL CONDUCTOR

(75) Inventors: Larwrence D. Radosevich, Muskego, WI (US); Daniel G. Kannenberg, Waukesha, WI (US); Steven C. Kaishian, Wauwatosa, WI (US); Steven T. Haensgen, Oak Creek, WI (US); Patrick S. Murray, Muskego, WI (US); William A. Schwemmer, Mukwonago, WI (US)

(73) Assignee: Rockwell Automation Technologies, Inc., Mayfield Heights, OH (US)

( * ) Notice: Subject to any disclaimer, the term of this patent is extended or adjusted under 35 U.S.C. 154(b) by 0 days.

(21) Appl. No.: 09/133,782

(22) Filed: Aug. 12, 1998

(51) Int. Cl.$^7$ ............................. G01R 1/20; G01R 33/00
(52) U.S. Cl. .................................. 324/117 H; 324/127
(58) Field of Search ................................ 324/117 H, 96, 324/207.2, 207.21, 127, 117 R, 126, 251; 338/32 H; 336/221

(56) References Cited

U.S. PATENT DOCUMENTS

| | | | | |
|---|---|---|---|---|
| 4,048,670 A | * | 9/1977 | Eysermans | 361/421 |
| 4,188,605 A | * | 2/1980 | Stout | 338/32 H |
| 4,266,189 A | | 5/1981 | Karlin et al. | 324/117 H |
| 4,456,943 A | * | 6/1984 | Judy | 361/160 |
| 4,897,914 A | | 2/1990 | Loubier | 29/602.1 |
| 5,352,851 A | | 10/1994 | Wallace et al. | 361/764 |
| 5,389,739 A | | 2/1995 | Mills | 174/52.4 |
| 5,391,098 A | | 2/1995 | Ohashi | 439/830 |
| 5,621,913 A | | 4/1997 | Tuttle et al. | |
| 5,656,985 A | | 8/1997 | Lu et al. | |
| 5,963,028 A | * | 10/1999 | Engel et al. | 324/207.2 |

FOREIGN PATENT DOCUMENTS

| | | | | |
|---|---|---|---|---|
| CA | 1010503 | * | 5/1977 | 324/117 H |
| GB | 2202337 A | * | 9/1988 | 324/117 H |
| JP | 0067463 | * | 3/1987 | 324/117 H |
| JP | 0170073 | * | 7/1991 | 324/117 H |

OTHER PUBLICATIONS

IBM Techical Disclosure Bulletin, vol. 17, No. 11, Apr. 1975, pp. 3218–3219.*

"Methods of Current Measurement"; by Bill Drafts, F. W. Bell; SENSORS; 1996.

* cited by examiner

*Primary Examiner*—Jay Patidar
(74) *Attorney, Agent, or Firm*—Himanshu S. Amin; Alexander M. Gerasimow; William R. Walbrun

(57) ABSTRACT

A Hall-effect sensor package for sensing electrical current in an electrical conductor, is provided which includes a ferromagnetic core having an air gap, the core allowing for the electrical conductor to pass therethrough. The sensor package also includes a Hall-effect generator, at least a portion of the Hall-effect generator being located within the air gap, and a lead frame coupled to the Hall-effect generator. An insulative material is used to encapsulate the Hall-effect generator and at least a portion of the core and the lead frame. The insulative material facilitates binding of the Hall-effect generator, the lead frame and the core. The insulative material also facilitates protecting the Hall-effect generator from contaminants.

35 Claims, 11 Drawing Sheets

HALL EFFECT CURRENT SENSOR PACKAGE FOR SENSING ELECTRICAL CURRENT IN AN ELECTRICAL CONDUCTOR

TECHNICAL FIELD

The present invention relates to a Hall-effect current sensor package that enhances the performance of a Hall-effect current sensor.

BACKGROUND OF THE INVENTION

Electrical current sensors are known and are in wide use today throughout the electronics industry. One particular, type of current sensor is a Hall-effect sensor. In general, a Hall-effect type sensor may be employed to determine the amount of current passing through a conductor by sensing a magnetic field associated with the current, and in turn producing a Hall-effect output voltage that is proportional to the magnetic field.

The Hall effect is a well known phenomenon occurring in conductors and semiconductor materials wherein a current flowing generally perpendicular to a magnetic field induces a voltage perpendicular to both the field and current, which voltage is proportional to the product of the current and magnetic field.

More particularly, the Hall effect output voltage is the voltage produced across opposite edges of the conductor when placed in a magnetic field. The basis of this effect, which depends upon the deflection of charged particle moving in a magnetic field, is the Loreritz force. This force is in a direction mutually perpendicular to the particle movement and the magnetic field direction. As a result, an output voltage occurs across the--conductor. This output voltage has a magnitude that depends upon the magnetic field present, the Hall coefficient and the excitation current in the conductor.

When the excitation current is held constant, the output voltage is proportional to the magnetic field produced by the current being sensed or measured.

Hall effect sensors generally include a constant current source, a gapped toroid core (e.g., lamination stack) and a Hall effect generator extending into the gap of the core. Positioning of the Hall effect generator within the gap is important because inaccurate and unsteady positioning of the Hall-effect generator within the gap may result in the Hall-effect sensor malfunctioning.

Additionally, environmental factors may also impact the proper functioning of the Hall-effect sensor. More particularly, outside contaminants (e.g., dust, dirt, grime, oil, fluids) may hinder the operation of the Hall-effect sensor.

In view of the above, there is a need in the art for a packaging arrangement that provides for secure and stable positioning of the Hall-effect generator inside the air gap of the Hall effect sensor. Moreover, it would be desirable for such an arrangement to also afford for insulating the Hall-effect sensor such that an impeding effect on the sensor resulting from contaminants is mitigated.

SUMMARY OF THE INVENTION

The present invention provides for a Hall-effect sensor packaging and method thereof which provides for good and reliable positioning of a Hall-effect generator within a gap of a core (e.g., lamination stack, laminated toroid) of a Hall-effect sensor. In particular, the Hall-effect generator may be positioned in either of a lead frame or circuit board such that the Hall-effect generator is suitably positioned within the gap. Once the Hall-effect generator is properly positioned within the gap, the Hall-effect generator and at least a portion of the core is encapsulated by an insulative material.

The insulative material provides for maintaining the Hall-effect generator at a desired position within the gap substantially permanently. As a result, the Hall-effect sensor of the present invention affords for accurate and consistent current measurement. Furthermore, the insulative material may provide for shielding significant components of the Hall-effect sensor from contaminants (e.g., dust, dirt, grime, oil, fluids).

Additionally, the present invention affords for having a core gap of substantially minimal length which provides for enhanced sensitivity. As a result of the enhanced sensitivity, the present invention is highly conducive for low current measurement applications. The substantially minimal core gap length is achieved because the present invention mitigates the need to individually insulate the Hall-effect generator. Conventional Hall-effect generators like many semiconductor devices require suitable packaging (e.g., via plastic) in order to protect the device. The packaging tends to make the Hall-effect generator thicker thus requiring a relatively long core gap length. In the present invention, the Hall-effect generator does not require a thick packaging, and a substantially thin coating of protective material may be employed instead because the Hall-effect generator will be encapsulated in insulative material (e.g., plastic) along with at least a portion of the Hall sensor core. Such encapsulation provides suitable protection for the Hall-effect generator that is conventionally achieved by individually packaging the Hall-effect generator. Thus, the present invention provides for employing a Hall-effect generator with small thickness which in turn provides for employing a core gap length of substantially minimal thickness.

Furthermore, the insulative material may be shaped in a manner which facilitates packaging of the entire Hall-effect sensor. In other words, the outside shell of the insulative material may be suitably molded such as for example to facilitate insertion of a component into a printed circuit board.

Additionally, the insulative material may provide additional structural support for the Hall-effect sensor by integrating the core and a lead frame or circuit board (employed to house the Hall-effect generator) into one unit. A beneficial result of such integration is that the Hall-effect sensor becomes more robust to mechanical vibrations. The insulative material also affords for increasing the strength of coupling between the core and the lead frame or circuit board.

In accordance with one embodiment of the present invention, a Hall-effect sensor package for sensing electrical current in an electrical conductor is provided. The Hall-effect sensor package includes a ferromagnetic core having an air gap, the core allowing for the electrical conductor to pass there through. The Hall-effect sensor package also includes a Hall-effect generator, at least a portion of the Hall-effect generator being located within the air gap. A lead frame is coupled to the Hall-effect generator; and an insulative material is used to encapsulate the Hall-effect generator and at least a portion of the core and the lead frame.

Another embodiment of the present invention provides for a Hall-effect sensor package for sensing electrical current in an electrical conductor. The sensor package includes a ferromagnetic core having an air gap, the core allowing for the electrical conductor to pass there through. The sensor also includes a Hall-effect generator, at least a portion of the Hall-effect generator being located within the air gap; and a first printed circuit board coupled to the Hall-effect generator, the first printed circuit board adapted to couple to a remote second printed circuit board. The sensor package further includes an insulative material for insulating the Hall-effect generator from contaminants, the insulative material encapsulating the Hall-effect generator and at least a portion of the core and the first circuit board.

Still yet another embodiment of the present invention provides for a method for forming a Hall-effect sensor package which includes the step of: using an insulative material to encapsulate a Hall-effect generator within an air gap of a Hall-effect sensor.

Another embodiment of the present invention provides for a Hall-effect sensor package for sensing a sum of electrical currents in at least two electrical conductors. The sensor package includes a ferromagnetic core having an air gap, the core allowing for the at least two electrical conductors to pass there through; and a Hall-effect generator, at least a portion of the Hall-effect generator being located within the air gap. The sensor package further includes a lead frame coupled to the Hall-effect generator; and an insulative material which encapsulates the Hall-effect generator and at least a portion of the core and the lead frame.

In accordance with another embodiment of the present invention, a Hall-effect sensor package for sensing electrical current in an electrical conductor is provided. The sensor package includes means for maintaining at least a portion of a Hall-effect generator within an air gap of a ferromagnetic core; and means for integrating the Hall-effect generator with the ferromagnetic core.

Another embodiment of the present invention provides for a Hall-effect sensor package for sensing electrical current in an electrical conductor. The sensor package includes a ferromagnetic core having an air gap of substantially minimal length, the core allowing for the electrical conductor to pass there through; and a Hall-effect generator, at least a portion of the Hall-effect generator being located within the air gap. Additionally, the sensor package includes a lead frame coupled to the Hall-effect generator, the lead frame facilitating postioning of at least a portion of the Hall-effect generator within the air gap; and an insulative material which encapsulates the Hall-effect generator and at least a portion of the core and the lead frame, the insulative material substantially protecting the Hall-effect generator from contaminants and facilitating binding of the Hall-effect generator, the lead frame and the core.

The invention comprises the features hereinafter fully described and particularly pointed out in the claims. The following description and the annexed drawings set forth in detail certain illustrative embodiments of the invention. These embodiments are indicative, however, of but a few of the various ways in which the principles of the invention may be employed. Other objects, advantages and novel features of the invention will become apparent from the following detailed description of the invention when considered in conjunction with the drawings.

BRIEF DESCRIPTION OF THE DRAWINGS

FIG. 4a is a perspective view of the Hall-effect sensor of FIG. 3b after portions of the lead frame have been removed and lead frame supports have been bent downward;

FIG. 4b is another perspective view of the Hall-effect sensor of FIG. 4a;

FIG. 5b is a top view of a lead frame to be used in the Hall-effect sensor package of FIG. 5a;

DETAILED DESCRIPTION OF THE PRESENT INVENTION

Figure 1A:
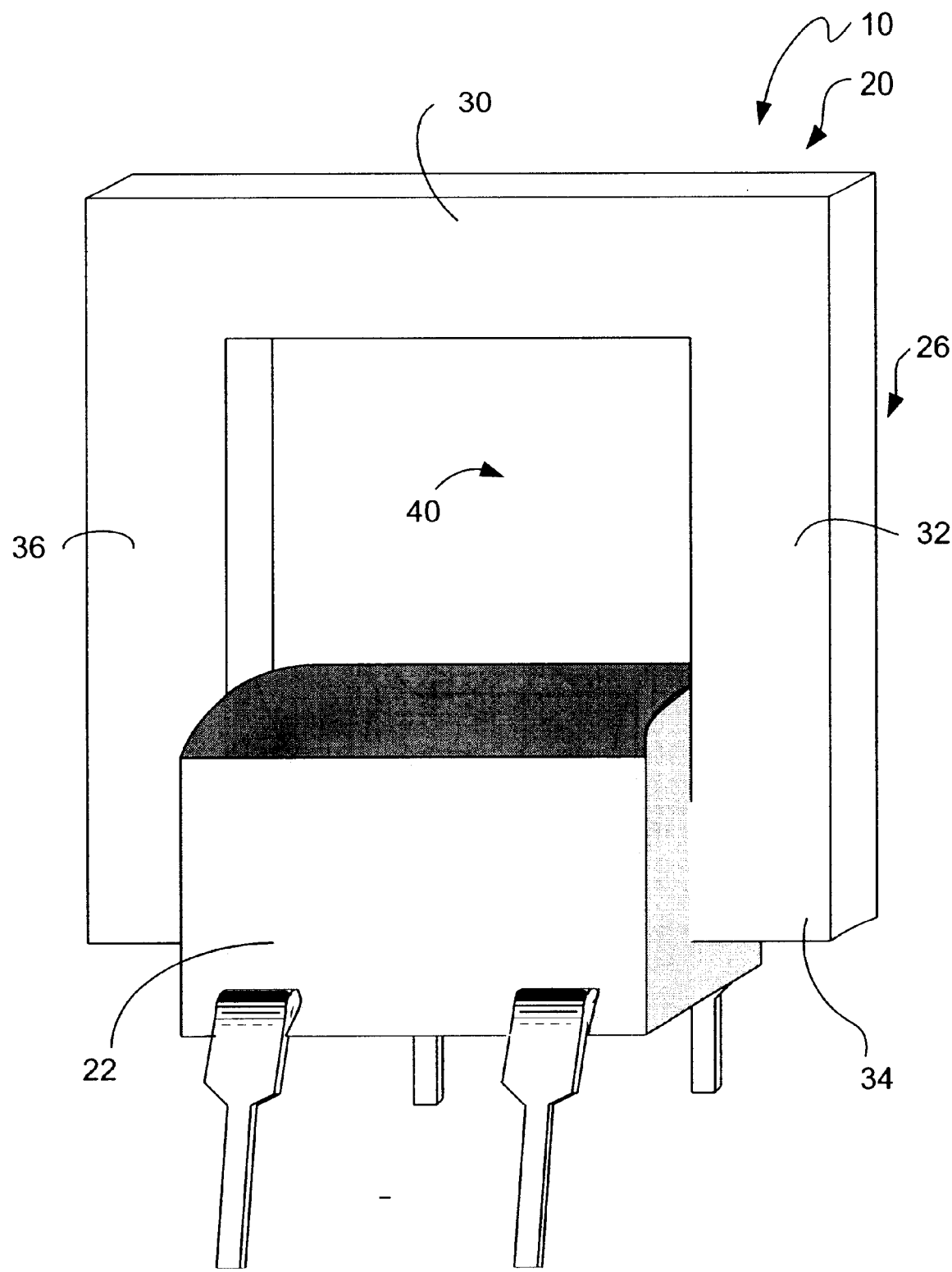
FIG. 1a is a perspective view of a Hall-effect sensor package in accordance with one specific aspect of the present invention.

The present invention will now be described with reference to the drawings, wherein like reference numerals are used to refer to like elements throughout.

As mentioned above, the present invention provides for a Hall-effect sensor packaging and method thereof which provides for good and reliable positioning of a Hall-effect generator within a gap of a core (e.g., lamination stack, toroid) of a Hall-effect sensor. In particular, the Hall-effect generator is positioned in either of a lead frame or circuit board such that the Hall-effect generator is suitably positioned within the gap. Once the Hall-effect generator is properly positioned within the gap, the Hall-effect generator and at least a portion of the core is encapsulated by an insulative material.

Figure 1B:
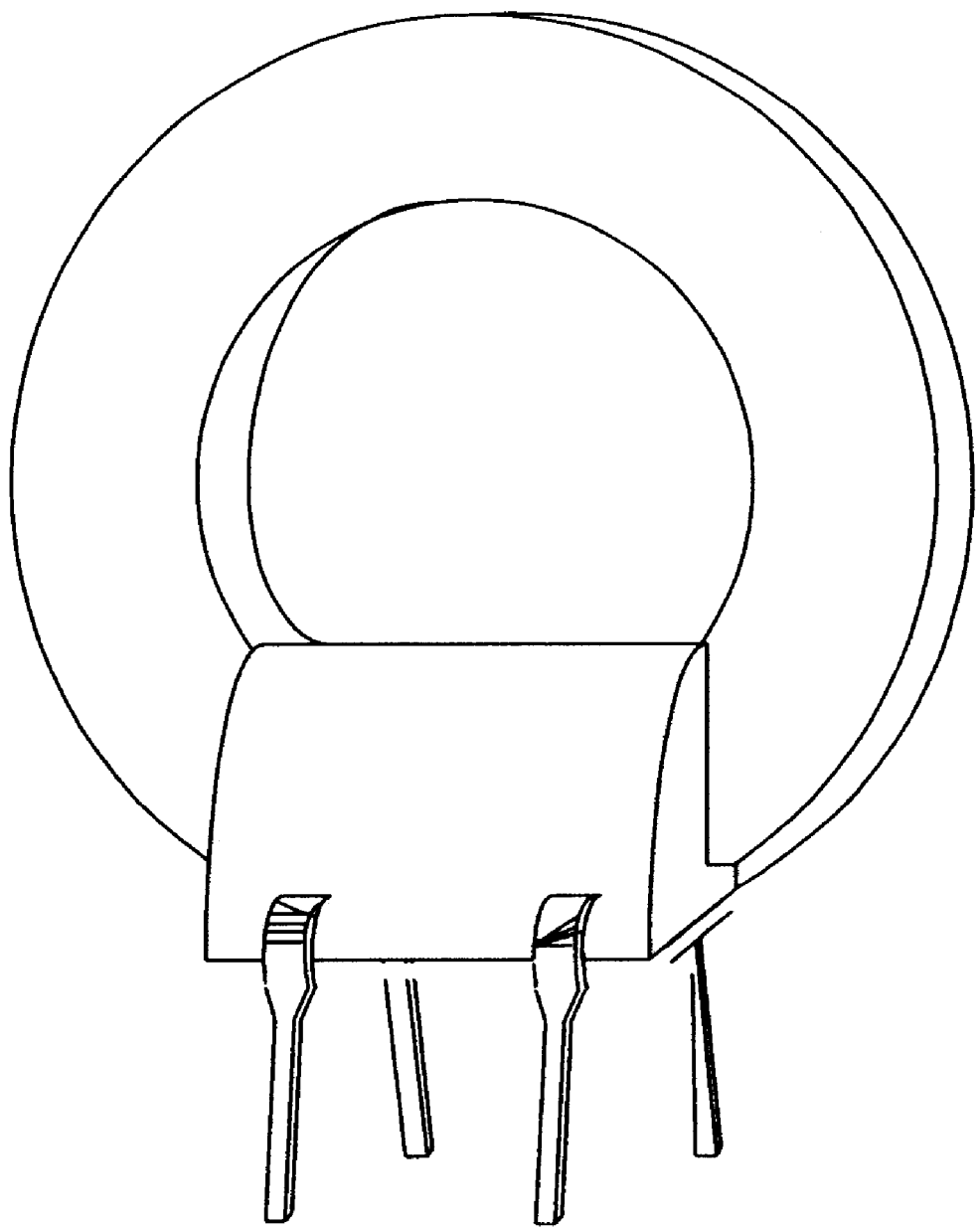
FIG. 1b is a perspective view of a Hall-effect sensor package in accordance with one aspect of the present invention.

Turning now to FIG. 1a, an exemplary embodiment of the present invention is shown in perspective view. A Hall-effect sensor package 10 is shown which includes a Hall-effect sensor 20 and an insulative material 22. The Hall-effect sensor 20 includes a ferromagnetic core 26. Preferably the core 26 is square in shape, however, it is to be appreciated that the core 26 may comprise any suitable shape (e.g., toroidal) as shown in FIG. 1b. The core 26 is fabricated from a plurality of ferromagnetic plates and in this particular embodiment is formed in the shape of a square. The ferromagnetic plates are preferably of high magnetic permeability so as to provide a low resistance to magnetic flux traversing the core material. An example of ferromagnetic materials with high permeability are the various NiFe alloys with greater than 50% Ni. It should be appreciated that other suitable materials may be employed to carry out the present invention and are intended to fall within the scope of the present invention. The core 26 includes a first leg 30, a second leg 32, a third leg 34 and a fourth leg 36. The core 26 may be stamped or otherwise formed from a single piece of ferromagnetic material. The core 26 defines a generally square opening 40 between the legs 30, 32, 34, 36. The opening 40 accommodates an electrical conductor or conductors (not shown) that pass through the opening 40. The conductor carries the electrical current that is to be measured. It is to be appreciated that the conductor may be wrapped around the core 26 to increase sensitivity for low current applications.

Figure 3A:
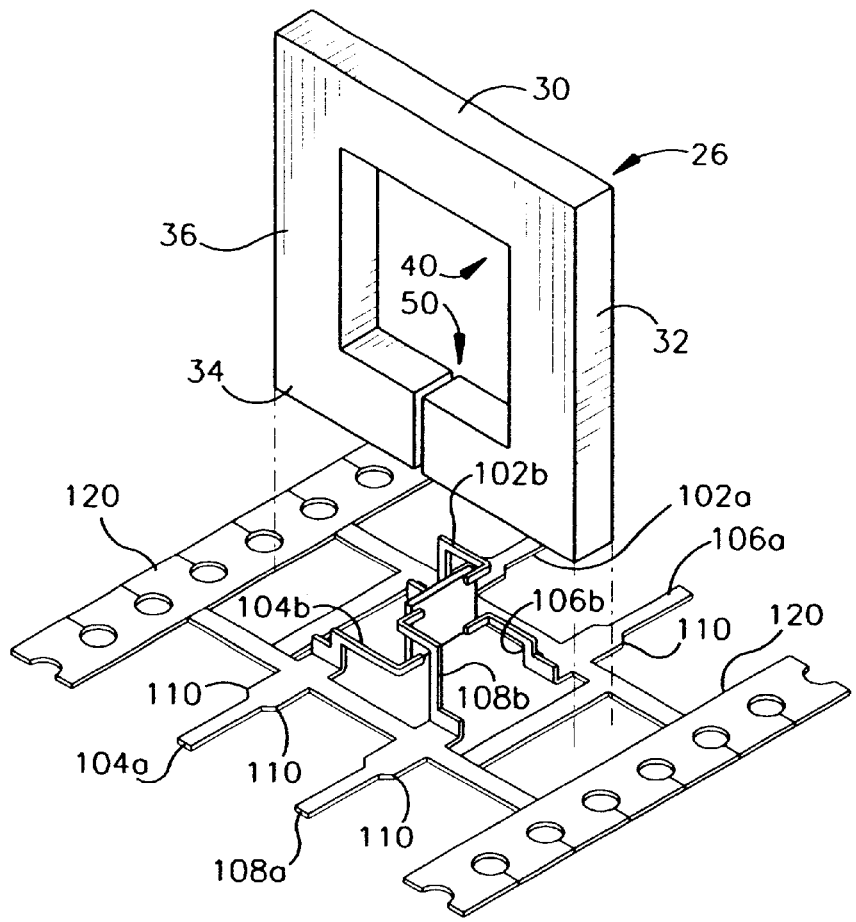
FIG. 3a is a perspective view of a Hall-effect sensor core being coupled to the lead frame of FIG. 2 having a Hall-effect generator mounted thereon in accordance with one specific aspect of the present invention.

The third leg 34 of the core 26 is severed at its middle to define an air gap 50 (FIG. 3a). Turning briefly to FIG. 3a, a Hall-effect generator 54 is located within the air gap 50 to detect and measure magnetic flux within the gap 50. In accordance with at least one particular aspect of the present invention, the Hall effect generator 54 comprises a layer of homogeneous semiconductor material, known as a Hall plate (not shown), constructed upon a dielectric substrate. An excitation current is applied to the Hall plate via contacts positioned on opposite ends of the Hall plate. When the Hall effect generator 54 is placed in a magnetic field and supplied with excitation current, a Hall effect output voltage is produced in the Hall plate which is orthogonal to the magnetic field and the excitation current. In order to measure this Hall effect output voltage, output leads are attached to the Hall plate in a position opposite to each other and on the axis of the Hall effect output voltage.

As is common in the industry, the electrical conductor whose current is to be sensed is positioned through the core 26. A constant current source (not shown) provides the Hall-effect generator 54 with a temperature-compensated low level current. The electrical current flowing through the conductor generates a proportional magnetic field in the core 26 and onto the Hall-effect generator 54. The Hall-effect generator 54 then produces an output voltage that is proportional to the magnetic field concentrated onto its Hall plate. This voltage is then amplified to obtain a useful level.

Proper positioning of the Hall effect generator 54 within the gap 50 is desired. Inaccurate and unsteady positioning of the Hall-effect generator 54 within or about the gap 50 may lead to improper functioning of the Hall-effect sensor 20. The present invention affords for employing a core 26 with an air gap 50 as small as about 0.014 inches and using a Hall-effect generator chip 54 having a width of about 0.012 inches. These parameters provide only about 0.001 inches of air space on either side of the Hall-effect generator 54 when positioned within the air gap 50. Conventional Hall-effect sensors do not provide for properly and consistently securing a Hall-effect generator within such a small air gap. Air gaps of small length afford for more accurate measuring of currents of small amplitude. It is to be appreciated that the air gap, 50 of the present invention may be suitably adjusted to vary magnetic flux density within the air gap 50.

As noted above, since the Hall-effect generator 54 of the present invention does not require the relatively thick plastic protective coating common to conventional devices, the Hall-effect generator 54 is substantially thin and thus affords for employing an air gap 54 having substantially minimal length. The Hall-effect generator 54 is protected by the insulative material 22 that substantially encapsulates the Hall-effect generator 54 and at least a portion of the core 26.

Until the present invention, printed circuit boards (PCBs) generally were manufactured needing to employ Hall-effect generators of thicknesses greater than 0.52 inches in order to obtain suitable results. However, such thickness of the Hall-effect generator was not conducive to the space constraints of the PCBs. Consequently, current transformers were employed instead to measure current. But, a Hall effect sensor is more desirable because unlike the current transformer the Hall-effect sensor can detect true RMS current and thus may be applied to variable frequency drive applications. As will be apparent from the discussion herein, the present invention provides for a Hall-effect sensor package 10 that is readily applicable for use in conjunction with printed circuit boards and variable frequency drive applications.

As a result of using the insulative material 22 to facilitate securing the Hall-effect generator 54 to the lead frame 70 (FIG. 2) and to a portion of the core 26, the Hall-effect sensor of the present invention is substantially robust and is less susceptible to future misalignment of the Hall-effect generator 54 as compared to many conventional devices.

The Hall-effect generator 54 is mounted within the lead frame 70 which affords for suitably positioning the Hall-effect generator 50 within the air gap 50. The Hall-effect generator 54 cannot be seen in FIG. 1a because it is encapsulated within the insulative material 22. The insulative material 22 substantially fixes the Hall-effect generator 54 permanently to a desired position within the air gap 50. Furthermore, the insulative material 22 also secures the Hall-effect generator 54 to the lead frame 70, and also secures the lead frame 70 to a portion of the core 26. The insulative material 22 is preferably a non-magnetic, electrically insulating material, such as any suitable molded plastic or the like. For example, the insulative material 22 may include thermoset or if remelting of the insulative material is desired thermoplastic may be employed. It is to be appreciated that any insulative material suitable for carrying out the present invention may be employed and falls within the scope of the present invention.

Figure 2:
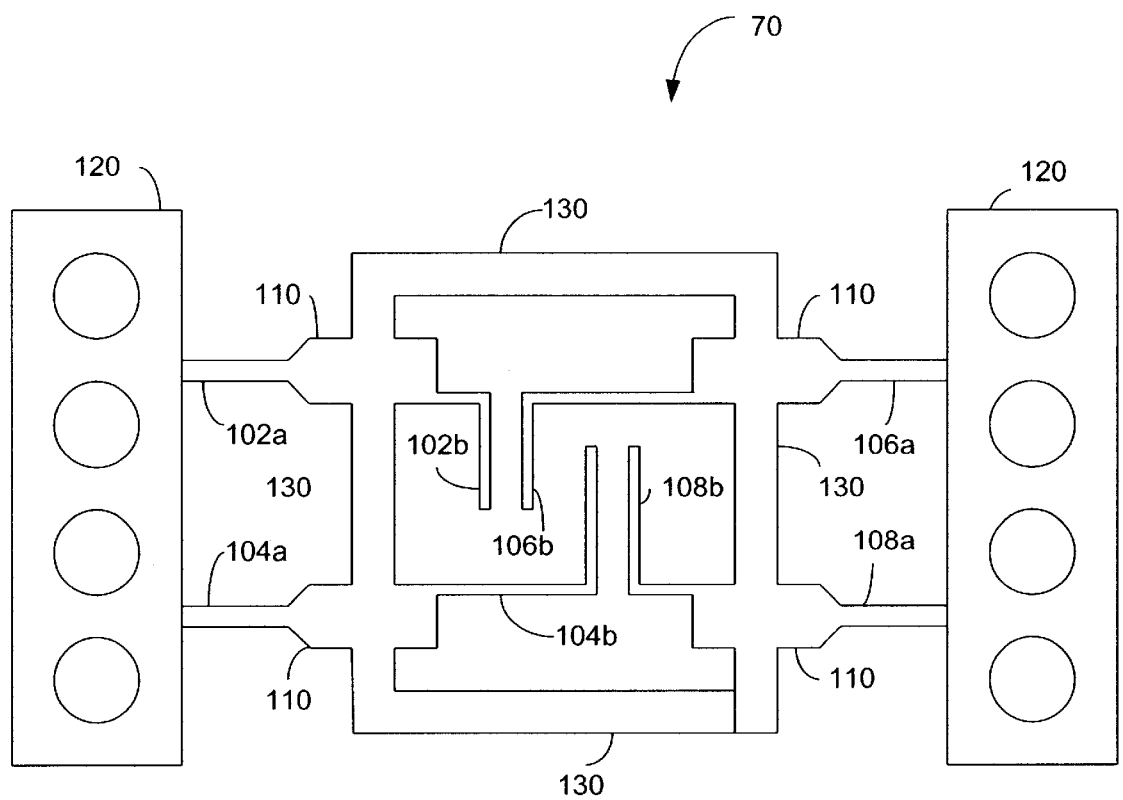
FIG. 2 is a top view of a lead frame in accordance with one specific aspect of the present invention.

Turning now to FIG. 2, the lead frame 70 is shown prior to being bent and cut in order to accommodate and position the Hall-effect generator 54. The lead frame 70 provides for mounting the Hall-effect generator 54 thereon, and for suitably positioning the Hall-effect generator 54 within the air gap 50 of the core 26. The lead frame 70 affords for mounting the Hall-effect sensor package 10 to a printed circuit board, for example (see FIG. 9). The lead frame 70 includes lead supports 102a, 104a, 106a and 108a. The lead supports 102a, 104a, 106a and 108a may be inserted into holes of a printed circuit board (PCB). The lead supports 102a, 104a, 106a and 108a each include stops 110 which prevent the lead supports 102a, 104a, 106a and 108a from being inserted into the holes of the PCB beyond a predetermined distance. The diameters of the holes in the PCB to which the supports are to be inserted in are chosen to provide sufficiently snug fits to the lead supports 102a, 104a, 106a and 108a in order to stabilize the Hall-effect sensor package 10 in a vertical orientation prior to soldering the lead supports 102a, 104a, 106a and 108a to conductors of the PCB.

The supports 102a, 104a, 106a and 108a serve as electrical inputs and outputs, respectively, for the Hall-effect generator 54. Supports 102a and 104a provide for delivering a constant current source to the Hall-effect generator 54. Supports 106a and 108a provide for delivering the Hall-effect output voltage from the Hall-effect generator 54 to the PCB. Each support 102a, 104a, 106a and 108a is coupled to a counterpart leg 102b, 104b, 106b and 108b, respectively, at the other end of each stop 110. The legs 102b, 104b, 106b and 108b are respectively attached (e.g., soldered, wire bond via ultrasonics) to contacts of the Hall-effect generator 54.

The lead frame 70 is preferably formed from a thin metal and thus the lead supports 102a, 104a, 106a and 108a are sufficiently resilient to easily withstand the force of inadvertent bumping without breaking off. In response to such force, the Hall-effect sensor package 10 would be momentarily deflected slightly and then return substantially to its original position. In the preferred embodiment, the lead frame 70 comprises a copper alloy, however, it is to be understood that the lead frame 70 may include any suitable material. Furthermore, since the lead frame 70 is formed from a thin metal, the lead frame supports 102a, 104a, 106a and 108a would be flexible enough to deform slightly to permit insertion into circuit board holes in situations where there is slight misalignment between the lead support and hole.

The lead frame 70 is shown with the lead supports coupled to alignment holes 120, which are employed during the fabrication process of the lead frame 70. In order to position each lead-frame work piece correctly within each work station performing the various steps involved with the fabrication of the lead frames, each lead frame 70 contains the alignment holes 120 which match corresponding alignment pins (not shown) in supporting equipment, with which they become engaged for proper positioning at each work station. These same holes 120 are used, as the work piece progresses through the assembly line, during the steps of bonding, molding, trimming and forming the lead frame 70. Since each step is carried out within relatively narrow tolerances, it is desired that these alignment holes 120 remain in constant spatial relationship with respect to the rest of the lead frame 70. The alignment holes 120 are subsequently cut, punched or stamped off. The lead frame 70 also includes electrical shorting bars 130 that provide for electrically shorting the lead frame 70 during the fabrication process. The bars 130 are subsequently cut, punched or stamped off.

Figure 3B:
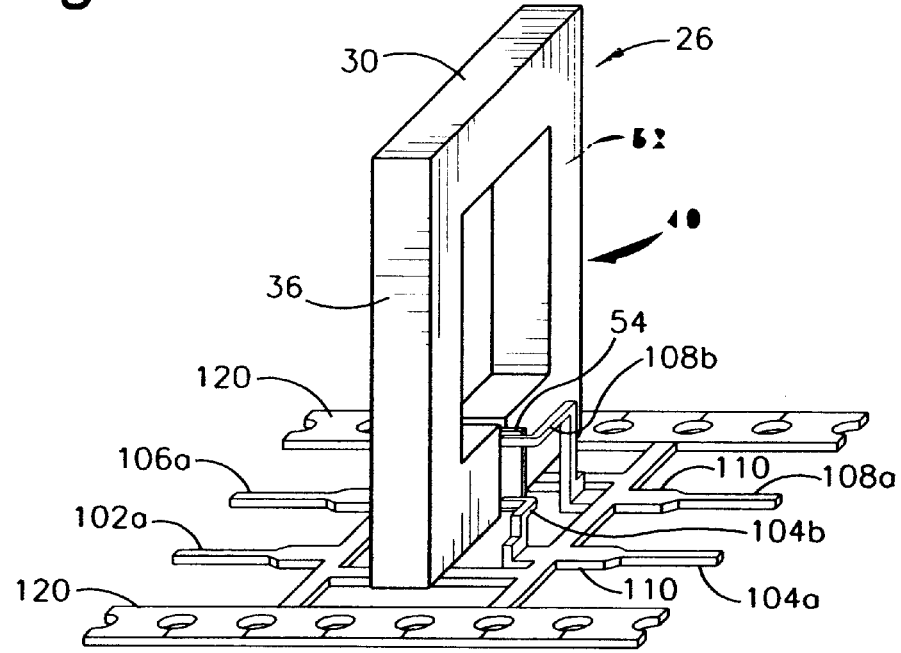
FIG. 3b is a perspective view of the Hall-effect sensor core of FIG. 3a after it has been coupled to the lead frame in accordance with one specific aspect of the present invention.
Figures 4A, 4B:
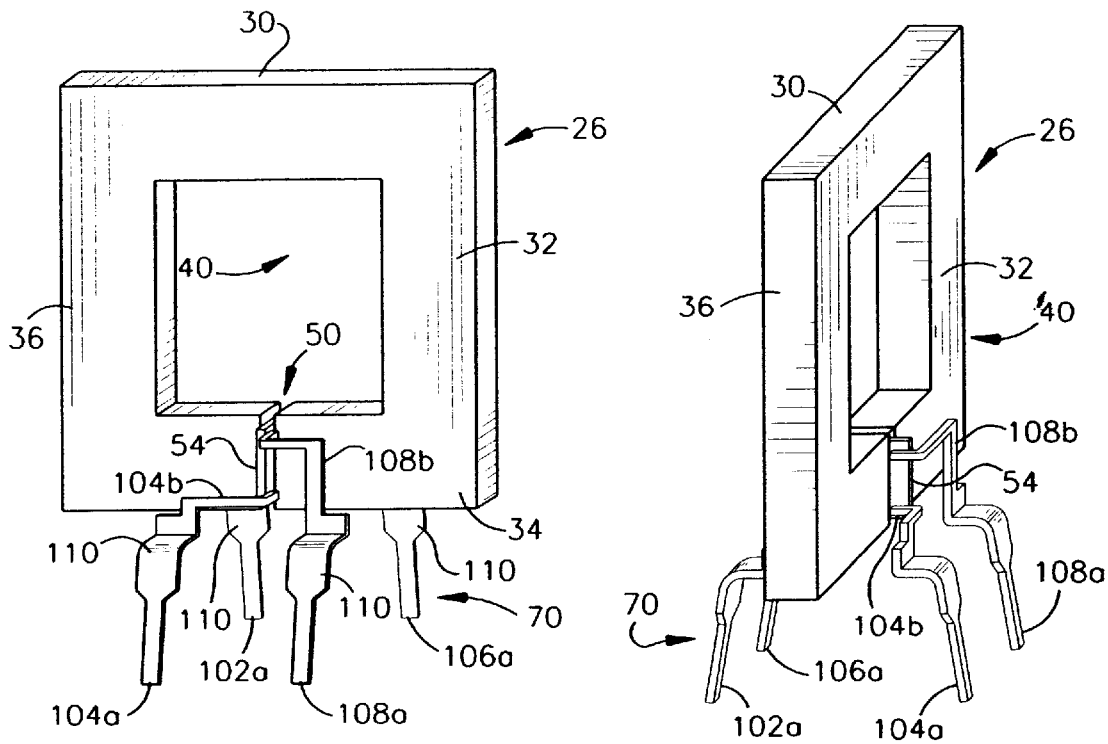

Turning now to FIGS. 3a and 3b, the lead frame 70 is shown with the Hall-effect generator 54 mounted thereon and being positioned within the gap 50 of the core 26. As can be seen in FIG. 3a, the legs 102b, 104b, 106b and 108b have been suitably bent and attached (e.g., soldered) to contacts of the Hall-effect generator 54. The alignment holes 120 are still part of the lead frame 70 at this stage in the process of fabricating the Hall-effect sensor package. The alignment holes 120 provide for proper alignment of the lead frame 70 with respect to the core 26 so that the Hall-effect generator 54 may be properly positioned within the air gap 50. As can be seen in FIGS. 4a and 4b, the Hall-effect generator 54 is positioned within the air gap 50 of the core 26. The core 26 may be lowered onto the Hall-effect generator 54 or the Hall-effect generator 54 (mounted on the lead frame 70) may be raised into the air gap 50. Thus, the lead frame 70 facilitates substantial perpendicular alignment and centering of the Hall-effect generator 54 to the magnetic field within the air gap 50.

The Hall-effect sensor 20 is shown in two different perspective views wherein the Hall-effect generator 54 is properly positioned within the air gap 50 of the core 26 by the lead frame 70. The alignment holes 120 and shorting bars 130 have been cut, punched or stamped out, and the supports 102a, 104a, 106a and 108a bent substantially downward for ease of insertion in and/or soldering to a PCB. The Hall-effect generator 54 and portions of the lead frame 70 and core 26 are subsequently encapsulated by the insulative material 22 as shown in FIG. 1a.

Figure 5C:
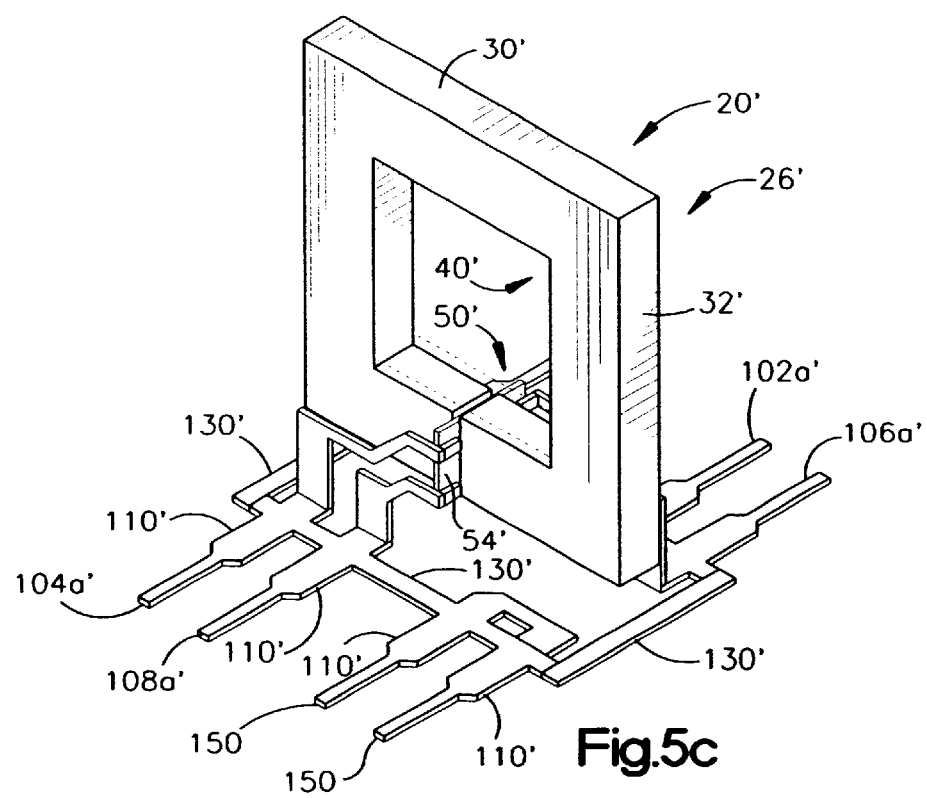
FIG. 5c is a perspective view of a Hall-effect sensor core of FIG. 5a coupled to the lead frame having a Hall-effect generator mounted thereon.
Figure 5A:
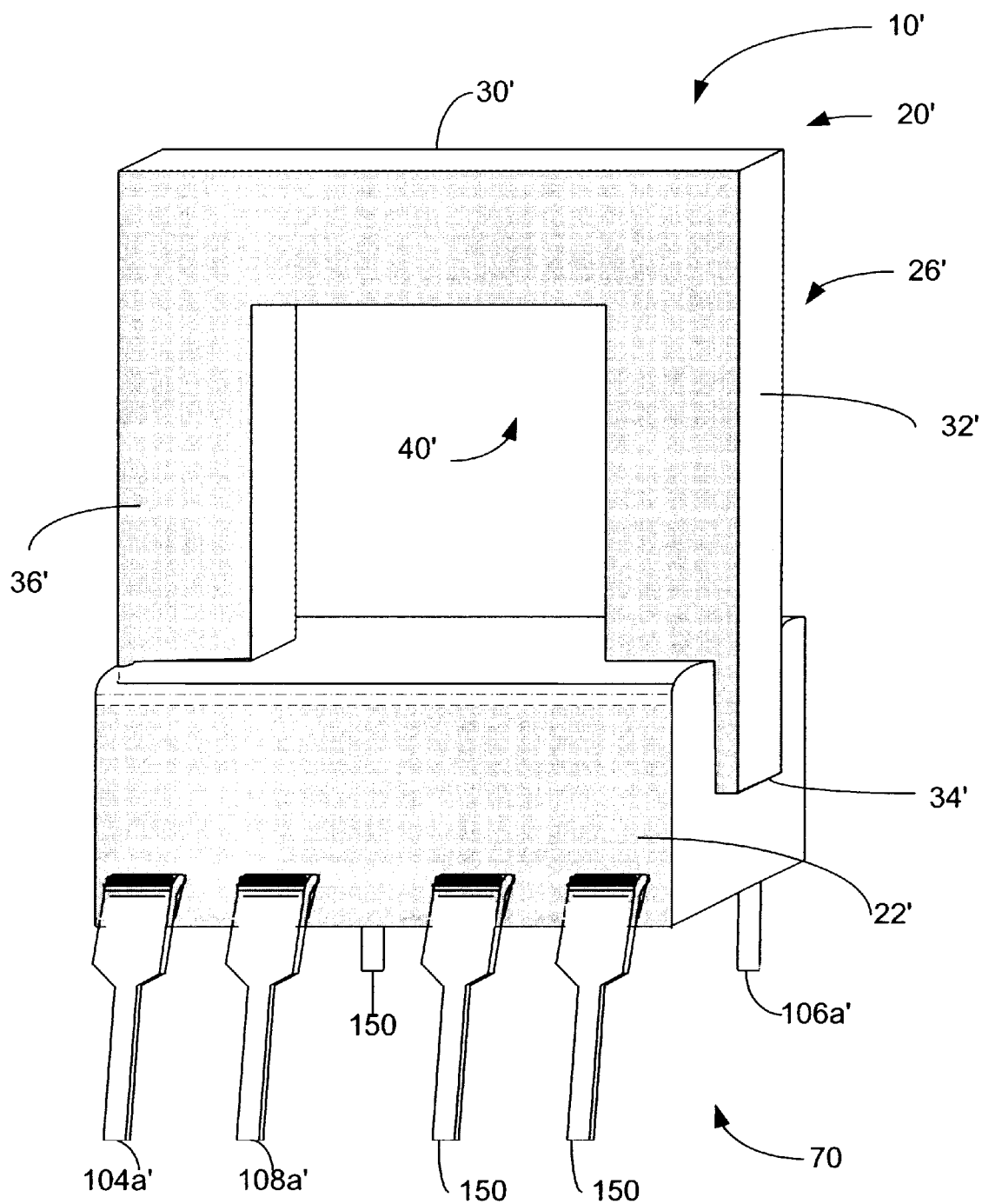
FIG. 5a is a Hall-effect sensor package in accordance with another aspect of the present invention.
Figure 5B:
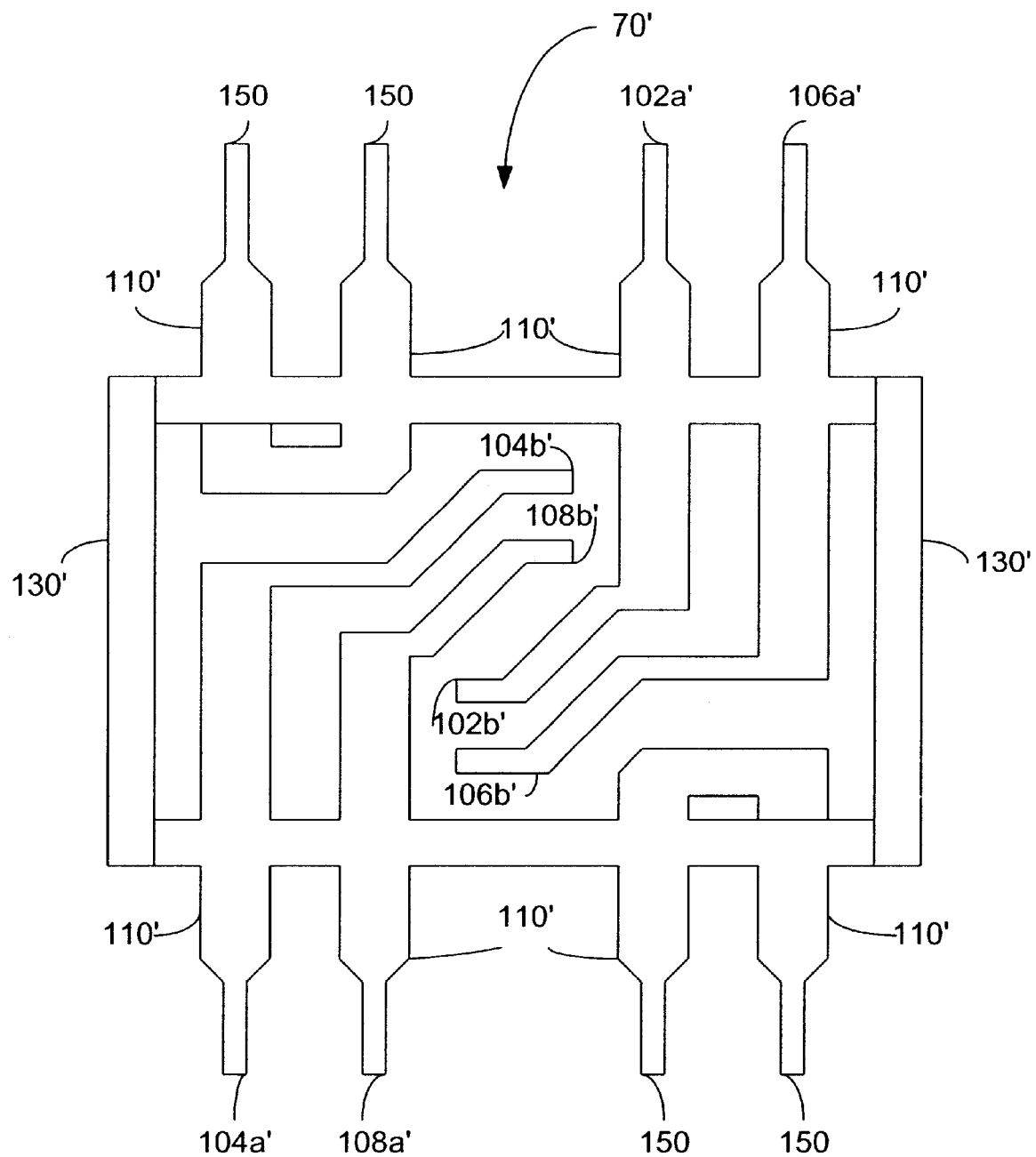

FIGS. 5a–c illustrate another embodiment of the present invention which is similar to the embodiment of FIG. 1 except that it includes a lead frame 70' having eight lead support legs as compared to four, and the insulative material 22' encapsulates a greater portion of core leg 34'. Like components to those of FIG. 1a will include like reference numerals followed by a prime "'". Further discussion with respect to like components is reduced or omitted for sake of brevity.

The lead frame 70' includes eight support leads, four of which (102a', 104a' 106a' and 108a') which are electrically functional and four other support leads 150 which are not electrically functional but provide for mechanical support of the Hall-effect sensor package 10'. By having eight lead supports, increased stability is provided to the Hall-effect sensor package 10'. Accordingly, this embodiment is suitable for larger and heavier conductor(s) that are to pass through the opening 40' of the Hall-effect sensor 20'. The larger lead frame 70' results in increased insulative material 22' being used as compared to the embodiment of FIG. 1a. Accordingly, the insulative material 22' encapsulates a greater portion of the bottom core leg 34'.

Figure 6:
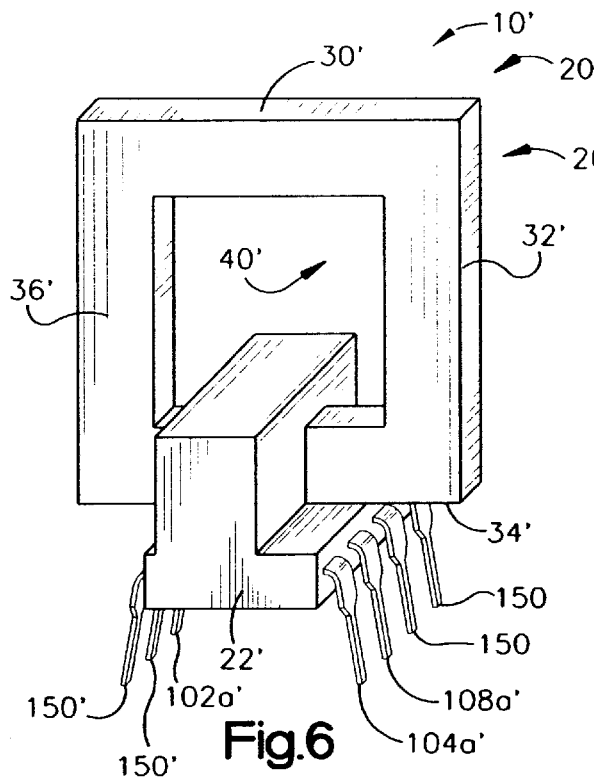
FIG. 6 is a Hall-effect sensor package in accordance with yet another aspect of the present invention.

FIG. 6 illustrates another embodiment of the present invention. This embodiment is similar to the embodiment of FIGS. 5a–5c except that the length direction of the lead frame 70' is perpendicular to the length direction of the core 26'. Like components between the embodiments of FIGS. 5a–5c and 6 include like reference numbers. In the embodiment of FIGS. 5a–5c, the length directions of both the lead frame 70' and the core 26' are in parallel. It is to be appreciated that the Hall-effect generator 54' is still positioned within the air gap 50' in the same orientation as that shown FIG. 5c. Accordingly, the lead legs 102b', 104b', 106b' and 108b' of the embodiment of FIG. 6 are suitably designed to provide for proper contacting with the Hall-effect generator 54'.

By orienting the lead frame 70' so that its length direction is perpendicular to the length direction of the Hall-effect sensor 20', the present embodiment of FIG. 6 provides for a strong support for the Hall-effect sensor package 10'.

It will be appreciated that various PCB space requirements may favor one of the embodiments of FIGS. 1a, 5a–5c and 6 over the other. Furthermore, it is to be understood that the scope of the present invention is not intended to be limited to only the herein described embodiments but rather the invention is to be broadly construed to encompass any Hall-effect sensor package suitable for carrying out the present invention.

Figure 7B:
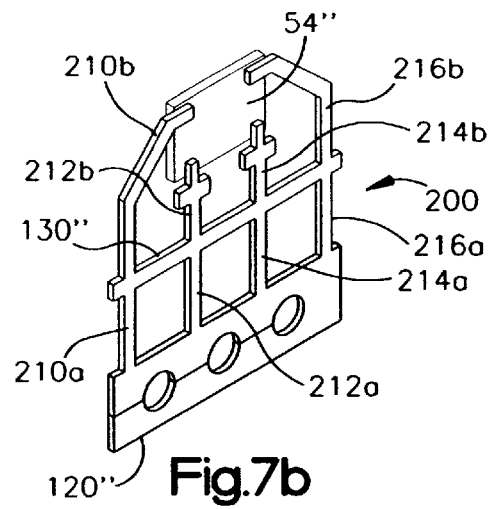
FIG. 7b is a perspective view of a lead frame having a Hall-effect generator mounted thereon.
Figure 7A:
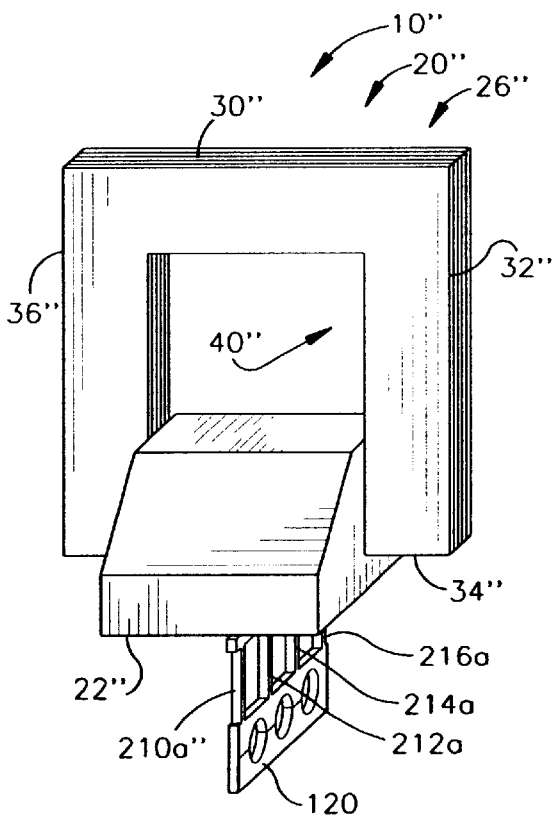
FIG. 7a is perspective view of a Hall-effect sensor package in accordance with another aspect of the present invention.
Figure 7C:
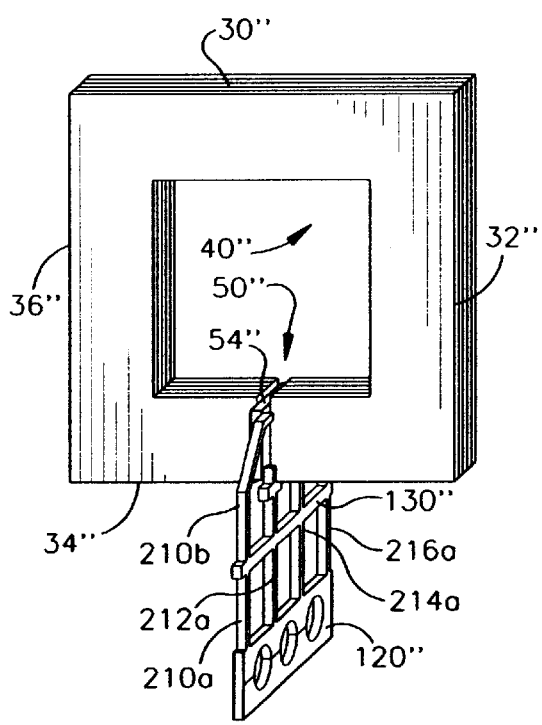
FIG. 7c is perspective view of a Hall-effect sensor core of FIG. 7a coupled to the lead frame of FIG. 7b.

Turning now to FIGS. 7a–7c, another embodiment of the present invention is shown employing a different type of lead frame 200 (FIG. 7b) from-the embodiments of FIGS.

1a, 5a–5c and 6. In this embodiment, the lead frame 200 includes lead supports 210a, 212a, 214a and 216a which are oriented substantially parallel to one another. Like components between the present embodiment and that of the other embodiments will employ like reference numbers followed by a double prime (").

The Hall-effect generator 54' is mounted to the lead frame 200 and than suitably positioned in the gap 50" of the core 26". In this embodiment, the lead supports 210a, 212a, 214a and 216a do not provide for as much support of the Hall-effect sensor package as compared to the earlier discussed embodiments. The support leads 210a, 212a, 214a and 216a serve mostly to provide electrical contact between the Hall-effect generator 54" and a remote device (e.g., printed circuit board).

The insulative material 22" of this embodiment is shown to have a substantially rounded topside which facilitates sliding a conductor through the core opening 40". In this particular embodiment, the support leads 210a, 212a, 214a and 216a may pass completely through holes of a PCB so that the bottom side of the insulative material 22" lies on the surface of the PCB. Thus, the insulative material 22" provides for the advantages mentioned above with respect to the other embodiments and also provides for substantially supporting the Hall-effect sensor package 10".

Figure 8A:
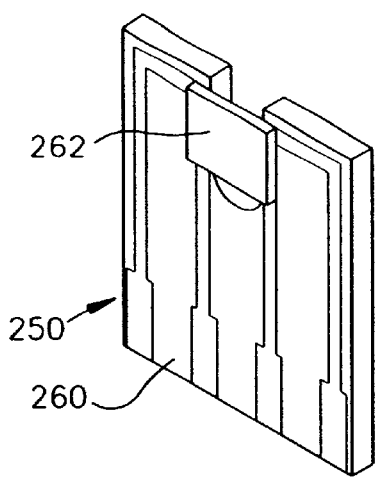
FIG. 8a is a perspective view of a printed circuit board having a Hall-effect generator mounted thereon.
Figure 8B:
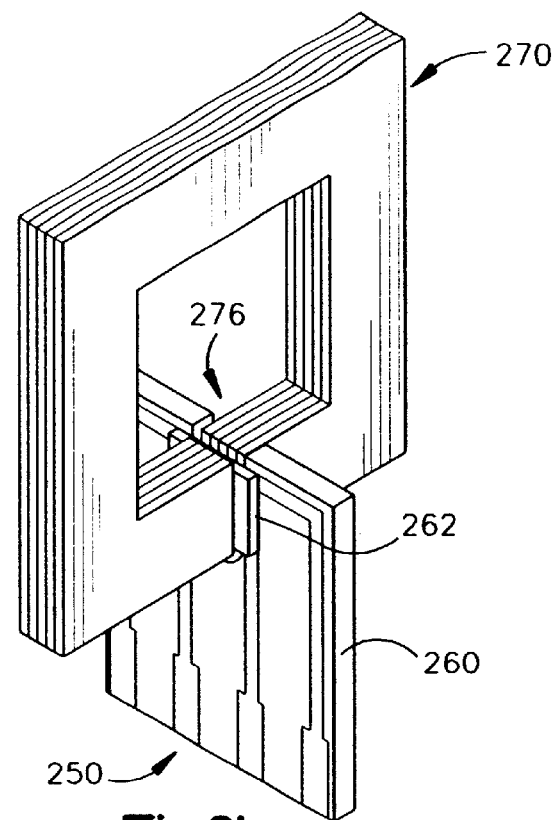
FIG. 8b is a perspective view of the printed circuit board of FIG. 8a having a Hall-effect generator mounted thereon coupled to a Hall-effect sensor core.

Turning now to FIGS. 8a–8b, another specific embodiment of the present invention is shown. In this embodiment, a lead frame 250 is formed on a printed circuit board 260. A Hall-effect generator 262 is suitably mounted on the printed circuit board 260 such that contacts of the Hall-effect generator are in electrical contact with respective leads of the lead frame 250. As shown in FIG. 8b, the printed circuit board 260 with the Hall-effect generator 262 mounted thereon is coupled to a Hall-effect sensor core 270 such that the Hall-effect generator 262 is suitably positioned within an air gap 276 of the core 270.

Figure 8C:
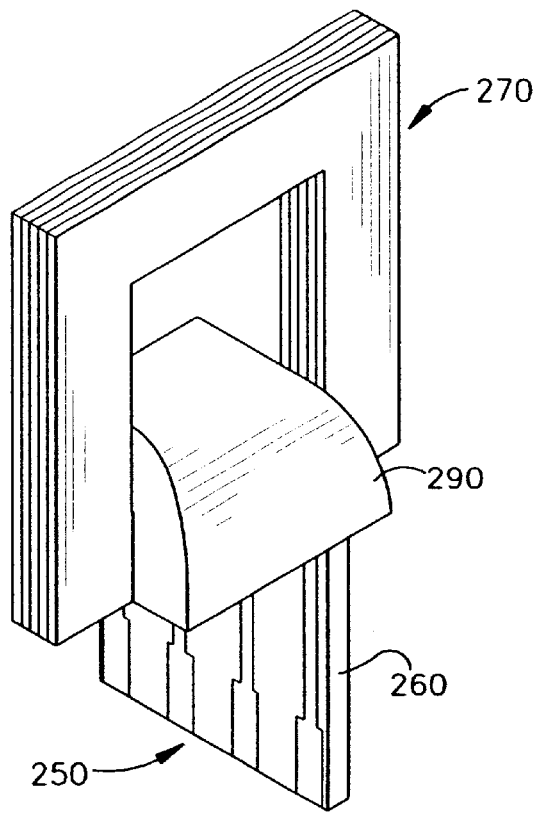
FIG. 8c is a perspective view of the Hall-effect sensor of FIG. 8b including an insulative material encapsulating the Hall-effect generator within an air gap of the Hall-effect sensor core.

If desired, the present embodiment may also incorporate an insulative material 290 as shown in FIG. 8c to encapsulate the Hall-effect generator 262 within the air gap 276 and also encapsulate portions of the core 270 and PCB 260 to generate the aforementioned advantages associated with such encapsulation of portions of a Hall-effect sensor.

Figure 9:
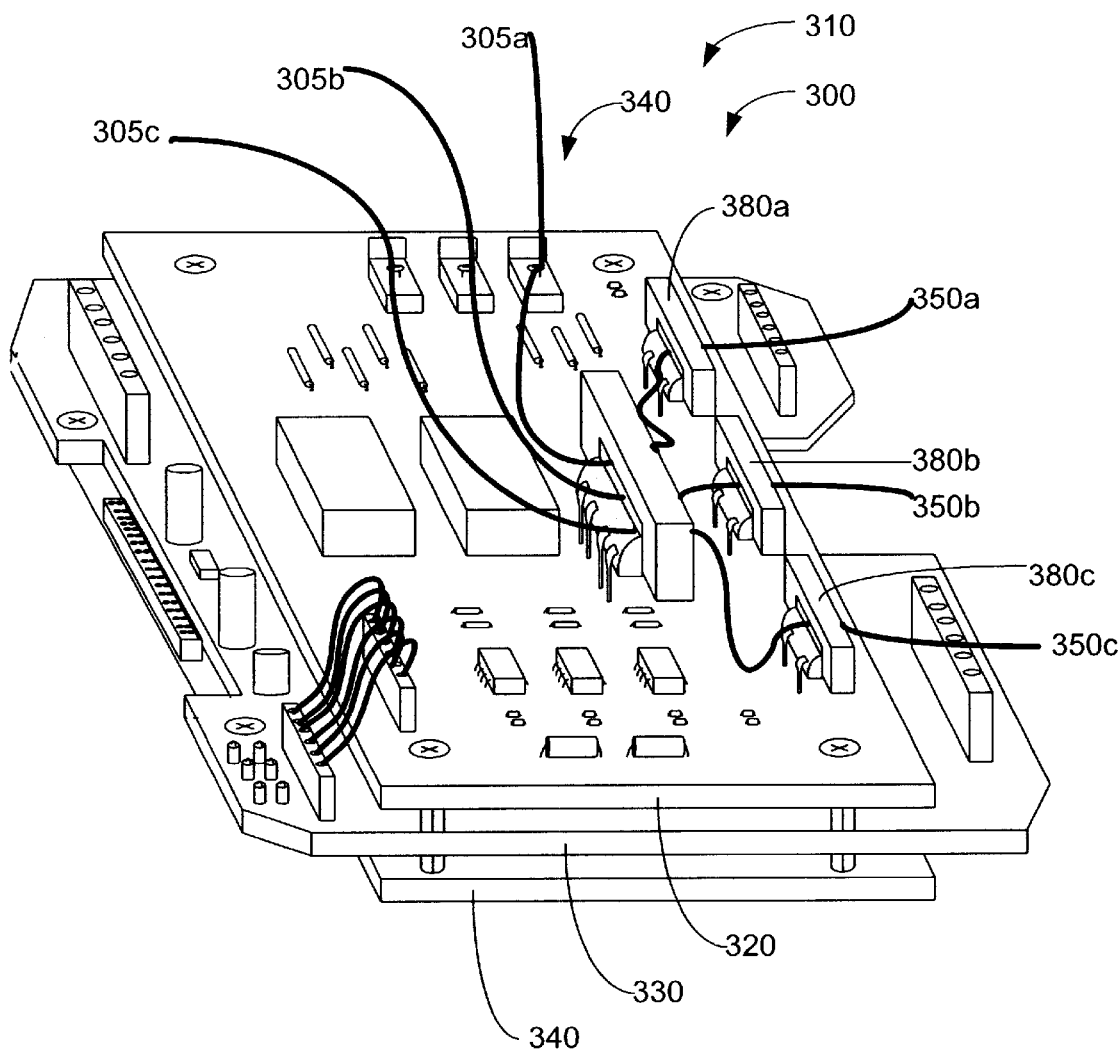
FIG. 9 is a perspective view of a motor control/diagnostic module employing Hall-effect sensor packages in accordance withthe present invention.

Turning now to FIG. 9, a detailed perspective illustration of a stacked circuit board arrangement 300 of a diagnostic module 310 is shown in accordance with one specific implementation of the present invention. The stacked circuit board arrangement 300 includes a power board 320 located on the top of the stack 300, an analog to digital (A/D) converter board 330 below the power board 310, and a processor/memory board 340 below the A/D board 320.

The power board 320 includes 3 contacts 340 for receiving 3-phase input power from power lead wires 350a–350c to supply power to a motor (not shown) being monitored by the diagnostic module 310. The wires are first run respectively through Hall current sensor packages 380a–380c (embodiment of FIG. 1a), one phase wire per current sensor 380. Although, the diagnostic module 310 is shown employing Hall-effect sensor packages of the embodiments of FIG. 1a and FIG. 5, any suitable Hall-effect sensor package described above or suitable for carrying out the present invention may be employed. The Hall-effect sensor packages 380a–380c provide for measuring the amount of current flowing through the respective conductors 350a–350c.

Next, all three conductors 350a–350c are together passed through a single Hall-effect sensor package 390 (embodiment of FIG. 5). The Hall-effect sensor package 390 is employed to determine if the current flowing through the three 3φ conductors is balanced (i.e., sum of all currents passing through the conductors equals zero). It will be appreciated by one skilled in the art that the distance between conductor 350a to conductor 350b is substantially the same as the distance between conductor 350c and conductor 350b in order to be able to determine if the current flowing through the conductors if properly balanced. It will be appreciated that the Hall-effect sensor 390 may be employed as a ground fault current sensor.

By employing the Hall-effect sensor packages 380a, 380b, 380c and 390 of the present invention in the diagnostic module 310, good and reliable positioning of a Hall-effect generator within a gap of a core of the respective Hall-effect sensors is obtained. The insulative material of the Hall-effect sensor packages provides for maintaining the Hall-effect generator at a desired position within the gap substantially permanently. As a result, the Hall-effect sensor packages of the present invention affords for good and consistent current measurement. Furthermore, the insulative material may provide for shielding significant components of the Hall-effect sensor from ambient noise, environmental conditions (e.g., temporary temperature fluctuations) and contaminants (e.g., dust, dirt, grime, oil, fluids).

The insulative material is shaped such that the conductors 350 may easily pass through the Hall-effect sensors. Additionally, the insulative material may provide additional structural support for the Hall-effect sensors by integrating their respective core and a lead frame or circuit board (employed to house the Hall-effect generator) into one unit. A beneficial result of such integration is that the Hall-effect sensor becomes more robust to mechanical vibrations. The insulative material also affords for increasing the strength of coupling between the core and the lead frame or circuit board.

Figure 10:
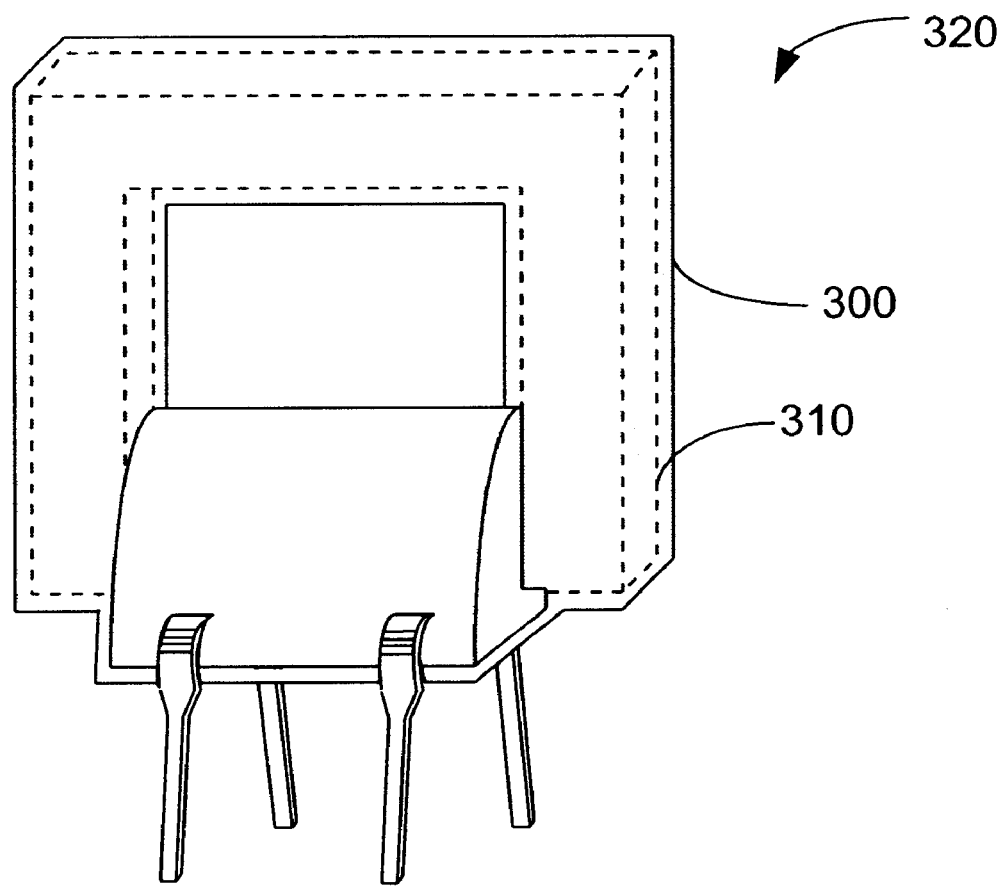
FIG. 10 is a perspective view of a Hall-effect sensor package wherein insulative material encapsulates the entire Hall-effect sensor core in accordance with yet another specific aspect of the present invention.

Although the present invention has been described above with respect to specific embodiments of the present invention, it is to be appreciated that the present invention may be employed in numerous manners not specifically described herein. For example, the Hall-effect sensor package of the present invention may be fabricated such that insulative material 300 encapsulates an entire core 310 of a Hall-effect sensor 320 as shown in FIG. 10. Such an embodiment would afford for substantial insulation of the Hall-effect sensor from noise and contaminants.

It is, of course, not possible to describe every conceivable combination of components or methodologies for purposes of describing the present invention, but one of ordinary skill in the art will recognize that many further combinations and permutations of the present invention are possible. Accordingly, the present invention is intended to embrace all such alterations, modifications and variations that fall within the spirit and scope of the appended claims.

What is claimed is:

1. A Hall-effect sensor package for sensing electrical current in an electrical conductor, comprising:
    a ferromagnetic core having an air gap, the core allowing for the electrical conductor to pass there through;
    a Hall-effect generator, at least a portion of the Hall-effect generator being located within the air gap;
    a lead frame coupled to the Hall-effect generator; and
    an insulative material which encapsulates the Hall-effect generator and at least a portion of the core and the lead frame, whereby the electrical conductor can pass through the core.

2. The sensor package of claim 1, the insulative material comprising plastic.

3. The sensor package of claim 1, the insulative material comprising thermoplastic that is moldable to a desired shape.

4. The sensor package of claim 1, the insulative material comprising thermoset that is moldable to a desired shape.

5. The sensor package of claim 1, the lead frame including legs for electrically connecting to contacts of the Hall-effect generator.

6. The sensor package of claim 5, the legs being soldered to the contacts.

7. The sensor package of claim 5, the legs being connected to the contacts via wirebonding.

8. The sensor package of claim 5, the lead frame including electrically conductive supports for supporting the Hall-effect sensor package.

9. The sensor package of claim 1 in combination with a first printed circuit board (PCB), the lead frame being electrically coupled to the first PCB and oriented relative to the core to facilitate allowing the electrical conductor to pass through the core.

10. The sensor package of claim 9, further including a second PCB operatively coupleable to the first PCB.

11. The sensor package of claim 1, wherein the air gap is within the range of 0.1 to 0.010 inches.

12. The sensor package of claim 1, wherein the air gap is about 0.014 inches.

13. The sensor package of claim 1, wherein the Hall-effect generator has a thickness within the range of 0.02 to 0.01 inches.

14. The sensor package of claim 1, wherein the Hall-effect generator has a thickness of about 0.012 inches.

15. The sensor package of claim 1 used in an overload current detection application.

16. The sensor package of claim 1, wherein the core is substantially of square shape.

17. The sensor package of claim 1, wherein the core is substantially of rectangular shape.

18. The sensor package of claim 1, wherein the core is substantially of toroidal shape.

19. A Hall-effect sensor package for sensing electrical current in an electrical conductor, comprising:
   a ferromagnetic core having an air gap, the core allowing for the electrical conductor to pass there through;
   a Hall-effect generator, at least a portion of the Hall-effect generator being located within the air gap;
   a first printed circuit board coupled to the Hall-effect generator, the first printed circuit board adapted to couple to a remote second printed circuit board; and
   an insulative material for insulating the Hall-effect generator from contaminants, the insulative material encapsulating the Hall-effect generator and at least a portion of the core and the first circuit board, whereby the electrical conductor can pass through the core.

20. The sensor package of claim 19, the insulative material comprising plastic.

21. The sensor package of claim 19, the insulative material comprising thermoplastic that is moldable to a desired shape.

22. The sensor package of claim 19, the insulative material comprising thermoset that is moldable to a desired shape.

23. The sensor package of claim 19, the first printed circuit board including leads for providing electrical contact with the Hall-effect generator.

24. The sensor package of claim 19, wherein the air gap is within the range of 0.1 to 0.010 inches.

25. The sensor package of claim 19, wherein the air gap is about 0.014 inches.

26. The sensor package of claim 19, wherein the Hall-effect generator has a thickness within the range of 0.02 to 0.01 inches.

27. The sensor package of claim 19, wherein the Hall-effect generator has a thickness of about 0.012 inches.

28. A Hall-effect sensor package for sensing a sum of electrical currents in at least two electrical conductors, comprising:
   a ferromagnetic core having an air gap, the core allowing for the at least two electrical conductors to pass there through;
   a Hall-effect generator, at least a portion of the Hall-effect generator being located within the air gap;
   a lead frame coupled to the Hall-effect generator; and
   an insulative material which encapsulates the Hall-effect generator and at least a portion of the core and the lead frame, whereby the electrical conductor can pass through the core.

29. The sensor package of claim 28, including three electrical conductors that are each of different phase.

30. The sensor package of claim 28 being used in a ground fault current detection application.

31. A Hall-effect sensor package for sensing electrical current in an electrical conductor, comprising:
   means for maintaining at least a portion of a Hall-effect generator within an air gap of a ferromagnetic core; and
   means for encapsulating the Hall-effect generator and at least a portion of the ferromagnetic core to form an integrated assembly that facilitates allowing an electrical conductor to pass through the core.

32. A Hall-effect sensor package for sensing electrical current in an electrical conductor, comprising:
   a ferromagnetic core having an air gap of substantially minimal length, the core allowing for the electrical conductor to pass therethrough;
   a Hall-effect generator, at least a portion of the Hall-effect generator being located within the air gap;
   a lead frame coupled to the Hall-effect generator, the lead frame facilitating postioning of at least a portion of the Hall-effect generator within the air gap; and
   an insulative material which encapsulates the Hall-effect generator and at least a portion of the core and the lead frame, whereby the electrical conductor can pass through the core, the insulative material substantially protecting the Hall-effect generator from contaminants and facilitating binding of the Hall-effect generator, the lead frame and the core.

33. A Hall-effect sensor package, comprising:
   a ferromagnetic core having ends that are spaced apart from each other to provide an air gap, the core having an intermediate portion extending between the ends of the core to provide an opening through the core;
   a Hall-effect generator, at least a portion of the Hall-effect generator being located within the air gap;
   a lead frame coupled to the Hall-effect generator; and
   an insulative material which encapsulates the Hall-effect generator and at least a portion of the core and the lead frame, such that at least one electrical conductor can pass through at least part of the opening of the core.

34. The sensor package of claim 33, the lead frame further comprising a plurality of support leads that extend from the insulative material in a substantially parallel relationship for connecting the sensor package to a circuit board and supporting the core at a desired orientation relative to the circuit board so as to facilitate passage of the at least one electrical conductor through the opening of the core.

35. The sensor package of claim 34, at least some of the plurality of support leads being electrically functional and at least one of the plurality of support leads providing support while not being electrically functional.

* * * * *